US008789984B2

(12) United States Patent
Lee et al.

(10) Patent No.: US 8,789,984 B2
(45) Date of Patent: Jul. 29, 2014

(54) ORGANIC LIGHT EMITTING DISPLAY DEVICE AND ELECTRONIC DEVICE INCLUDING THE SAME

(75) Inventors: Hyun-Hee Lee, Yongin (KR); Kyu-Seob Han, Yongin (KR); Tae-Hyeok Kang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 222 days.

(21) Appl. No.: 13/248,753

(22) Filed: Sep. 29, 2011

(65) Prior Publication Data
US 2012/0098426 A1  Apr. 26, 2012

(30) Foreign Application Priority Data

Oct. 22, 2010  (KR) .................. 10-2010-0103670

(51) Int. Cl.
*B60Q 3/04*  (2006.01)

(52) U.S. Cl.
USPC ........................................ 362/362; 313/512

(58) Field of Classification Search
CPC .............. H01L 51/524; H01L 51/5243; H01L 51/5246; F21V 15/04; H01J 9/26; H01J 7/44; G02F 1/133308
USPC ................... 313/512; 362/362, 369
See application file for complete search history.

(56) References Cited

U.S. PATENT DOCUMENTS

| 2006/0181212 A1 | 8/2006 | Sawa et al. | |
| 2008/0067933 A1 | 3/2008 | Wang et al. | |
| 2009/0058293 A1* | 3/2009 | Maeda | 313/512 |
| 2009/0174825 A1* | 7/2009 | Yee et al. | 348/801 |
| 2009/0179557 A1 | 7/2009 | Yee et al. | |
| 2009/0207560 A1* | 8/2009 | Lee | 361/679.01 |
| 2009/0256471 A1 | 10/2009 | Kim et al. | |
| 2009/0261718 A1 | 10/2009 | Ha et al. | |
| 2009/0322214 A1* | 12/2009 | Lee et al. | 313/504 |
| 2011/0199348 A1 | 8/2011 | Takatani et al. | |

FOREIGN PATENT DOCUMENTS

| KR | 10-2006-0091231 | 8/2006 |
| KR | 10-0722119 B1 | 5/2007 |
| KR | 10-2009-0079016 | 7/2009 |
| KR | 10-2009-0081863 | 7/2009 |
| KR | 10-2009-0093058 | 9/2009 |
| KR | 10-2009-0108345 | 10/2009 |
| WO | 2010044291 A | 4/2010 |

OTHER PUBLICATIONS

European Office Action issued by European Patent Office on Feb. 21, 2012 in the corresponding European Patent Application Serial No. 11186256.1, which also claims Korean Patent Application Serial No. 10-2010-0103670 as its priority document.

* cited by examiner

*Primary Examiner* — Anh Mai
*Assistant Examiner* — Andrew Coughlin
(74) *Attorney, Agent, or Firm* — Robert E. Bushnell, Esq.

(57) ABSTRACT

An organic light emitting display device has the function of buffering external impacts so as to improve the resistance of the organic light emitting display device to impact. An electronic device includes the organic light emitting display device. The organic light emitting display device includes: a frame; a first substrate disposed on the frame, a display unit being formed on a surface of the first substrate; a second substrate disposed so as to face the first substrate; a driver integrated circuit (IC) disposed on either the first substrate or the second substrate; and a buffer member formed so as to cover the driver IC.

15 Claims, 3 Drawing Sheets

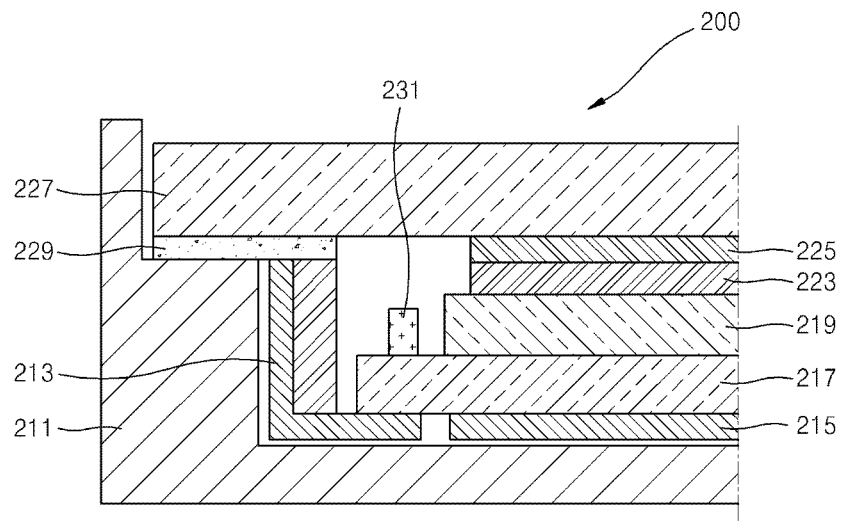
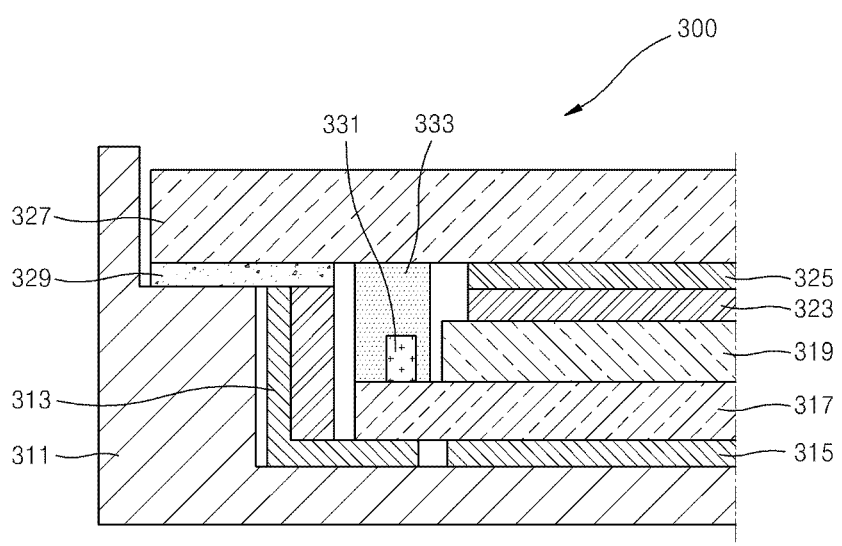

ORGANIC LIGHT EMITTING DISPLAY DEVICE AND ELECTRONIC DEVICE INCLUDING THE SAME

CLAIM OF PRIORITY

This application makes reference to, incorporates the same herein, and claims all benefits accruing under 35 U.S.C. §119 from an application earlier filed in the Korean Intellectual Property Office on Oct. 22, 2010 and there duly assigned Serial No. 10-2010-0103670.

BACKGROUND OF THE INVENTION

1. Field of the Invention

The present invention relates to organic light-emitting display devices and electronic devices including the same, and more particularly, to organic light-emitting display devices having a function of buffering external impacts so as to improve resistance to impact, and electronic devices including the organic light-emitting display devices.

2. Description of the Related Art

In general, flat display devices may be classified into an emissive type and a non-emissive type. Examples of the emissive type display devices are flat cathode ray tubes, plasma display panels (PDPs), electroluminescent devices, and light emitting diodes. Examples of the non-emissive type display devices are liquid crystal displays (LCDs). In this case, the electroluminescent devices have wide viewing angles, excellent contrast, and rapid response speeds, and thus they have recently been highlighted as next generation display devices. Such an electroluminescent device may be an inorganic electroluminescent device or an organic electroluminescent device according to the materials used to form the emissive layer.

The organic electroluminescent device is a self-luminous display which electrically excites fluorescent organic compounds and emits light, and it has been highlighted as a next generation display device which may be driven with a low voltage, is easily made to be thin, has a wide viewing angle, and has a rapid response speed.

The organic electroluminescent device includes an emissive layer which is formed of an organic material and interposed between an anode and a cathode. As an anode voltage and a cathode voltage are respectively applied to the anode and the cathode, holes injected from the anode move to the emissive layer through a hole transport layer and electrons move from the cathode to the emissive layer through an electron transport layer so as to recombine with each other in the emissive layer and form excitons. As the excitons change from an excited state to a ground state, fluorescent molecules of the emissive layer radiate, thereby forming an image. In a full-color type organic electroluminescent device, pixels which emit red R, green G, and blue B light are included so as to realize a full color spectrum.

In general, an organic light emitting display device includes a panel assembly in which an organic electroluminescent device is included, a housing accommodating the panel assembly, and a printed circuit board electrically connected to the panel assembly via a flexible circuit board.

SUMMARY OF THE INVENTION

One or more embodiments of the present invention provide organic light emitting display devices having the function of buffering external impacts so as to improve resistance to impact, and electronic devices including the organic light emitting display device are provided.

According to an aspect of the present invention, there is provided an organic light emitting display device comprising: a frame; a first substrate disposed on the frame, a display unit being formed on a surface of the first substrate; a second substrate disposed so as to face the first substrate; a driver integrated circuit (IC) disposed on either the first substrate or the second substrate; and a buffer member formed so as to cover the driver IC.

The substrate on which the driver IC is disposed, selected from the first substrate and the second substrate, may be longer than the other, and the driver IC may be disposed on an extended portion of the substrate on which it is disposed.

The frame and the first substrate may be closely adhered to each other.

According to another aspect of the present invention, there is provided an electronic device comprising: the above-described organic light emitting display device; a housing for accommodating the organic light emitting display device; and a transparent protection window disposed in front of the housing.

The buffer member may be disposed between the first substrate and the transparent protection window.

The buffer member may be disposed so as to contact the first substrate and the transparent protection window, respectively.

The housing and the frame may be closely adhered to each other.

The electronic device may further comprise a compressed buffer tape interposed between the housing and the first substrate.

The housing and the compressed buffer tape may be closely adhered to each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 2 is a cross-sectional view illustrating another organic light emitting display device;

FIG. 3 is a cross-sectional view illustrating an organic light emitting display device according to an embodiment of the present invention.

DETAILED DESCRIPTION OF THE INVENTION

The present invention will now be described more fully with reference to the accompanying drawings, in which an exemplary embodiment of the invention is shown, so that one of ordinary skill in the art may easily work the invention. The invention may, however, be embodied in many different forms and is not limited to the embodiment set forth herein.

Figure 1:
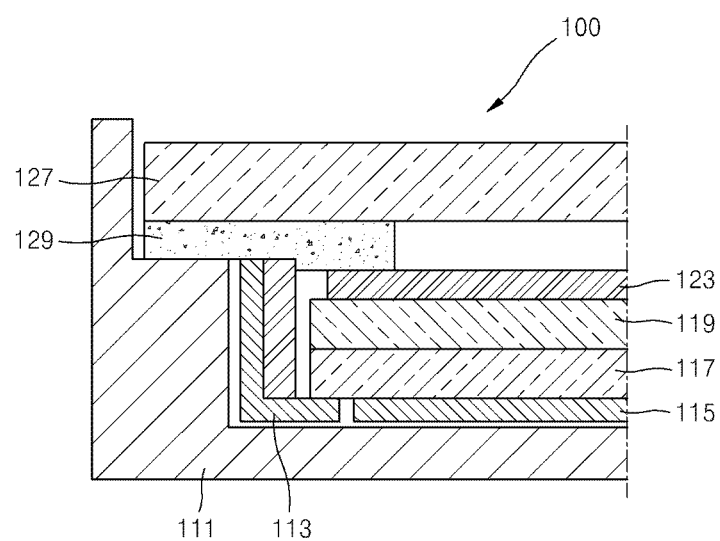
FIG. 1 is a cross-sectional view illustrating an organic light emitting display device.

FIG. 1 is a cross-sectional view illustrating an organic light emitting display device.

Referring to FIG. 1, the organic light emitting display device 100 includes a housing 111, a frame 113, a compressed buffer tape 115, a first substrate 117, a second substrate 119, a polarization plate 123, a transparent protection window 127, and an adhesive member 129.

The organic light emitting display device 100 has decreased brightness, transmittance, reflectivity and viewability due to an air layer existing in an empty space between the transparent protection window 127 and the polarization plate 123 attached to the second substrate 119. To solve this problem, a resin is filled into the empty space of the panel assembly.

FIG. 2 is a cross-sectional view illustrating another organic light emitting display device.

Referring to FIG. 2, the organic light emitting display device 200 includes a housing 211, a frame 213, a compressed buffer tape 215, a first substrate 217, a second substrate 219, a polarization plate 223, a resin 225, a transparent protection window 227, an adhesive member 229, and a driver integrated circuit (IC) 231.

As the resin 225 is formed to fill in an empty space in the panel assembly, the characteristics of the organic light emitting display device 200 may be improved but resistance to external impacts of the organic light emitting display device 200 may be decreased. That is, in the organic light emitting display device 100 illustrated in FIG. 1, when an impact is applied from the outside, the transparent protection window 127 is bent and thereby absorbs a portion of the impact, and the rest of the impact is transferred to a display unit (not shown). However, in the organic light emitting display device 200 illustrated in FIG. 2, an external impact is completely transferred to a display unit (not shown) without being buffered, and thus resistance to impact of the organic light emitting display device 200 is low.

In addition, the driver IC 231 for driving the display unit is disposed on either the first substrate 217 or the second substrate 219, and in order to mount the driver IC 231, the first substrate 217 and the second substrate 219 need to have different lengths as illustrated in FIG. 2. Due to the difference in the lengths, there is an empty space above the driver IC 231, and when an impact is applied from the outside, the organic light emitting display device 200 may break due to this empty space.

FIG. 3 is a cross-sectional view illustrating an organic light emitting display device 300 according to an embodiment of the present invention.

Referring to FIG. 3, the organic light emitting display device 300 includes a housing 311, a frame 313, a compressed buffer tape 315, a first substrate 317, a second substrate 319, a sealing unit (not shown), a polarization plate 323, a resin 325, a transparent protection window 327, an adhesive member 329, a driver IC 331, and a buffer member 333.

In the detail, the housing 311 constitutes the outer appearance of the organic light emitting display device 300, and the frame 313 accommodating a panel assembly is disposed inside the housing 311.

The panel assembly is accommodated in the frame 313 and includes the first substrate 317, the second substrate 319, and the sealing unit (not shown) coupling the first substrate 317 and the second substrate 319. In detail, a display unit (not shown) including an organic light emitting diode is formed on the first substrate 317. The first substrate 317 may be formed of a transparent glass material including $SiO_2$ as a main component. However, the first substrate 317 is not limited thereto, and may instead be formed of a transparent plastic material. The second substrate 319 is attached to the first substrate 317 on which the display unit (not shown) is formed. The second substrate 319 may be formed not only of a glass material, but also of any of various plastic materials such as acryl, or furthermore, a metal substrate. The first substrate 317 and the second substrate 319 are attached to each other via the sealing unit (not shown). The sealing unit (not shown) may be any conventional material such as a sealing glass frit.

The polarization plate 323, the resin 325 and the transparent protection window 327 are sequentially disposed on the second substrate 319, and the adhesive member 329 is formed around a boundary of the transparent protection window 327 so as to adhere the transparent protection window 327 to the housing 311. In this case, a gasket cushion adhesive is used as the adhesive member 329 so that the adhesive member 329 may also function as a predetermined buffer member.

The compressed buffer tape 315 is interposed between the housing 311 and the first substrate 317 so as to adhere the first substrate 317 to the housing 311 and, at the same time, reduce impacts applied to the first substrate 317, the second substrate 319 and the sealing unit (not shown).

The driver IC 331 for driving the display unit (not shown) is disposed on a portion of the first substrate 317, and the buffer member 333 is interposed between the first substrate 317 and the transparent protection window 327 so as to cover the driver IC 331. This will be described in further detail below.

As described above, in order for the driver IC 331 to be disposed on either the first substrate 317 or the second substrate 319, there must be a difference in lengths of the first substrate 317 and the second substrate 319. Due to this difference in the lengths, there is an empty space above the driver IC 331 and, when impact is applied from the outside, the organic light emitting display device 300 may break due to this empty space.

In order to solve this problem, the organic light emitting display device 300 further includes the buffer member 333 between the first substrate 317 and the transparent protection window 327 so as to cover the driver IC 331. The buffer member 333 may be formed of a gasket cushion adhesive, a buffer tape, or any of various other materials.

Table 1 below shows the result of impact tests performed on the organic light emitting display device 300 when the organic light emitting display device 300 includes, and when the organic light emitting display device 300 does not include, the buffer member 333 between the first substrate 317 and the transparent protection window 327. The impact test was conducted by dropping a 500 g weight from five positions and checking whether the organic light emitting display device 300 has broken. In the test, the weight was dropped from a height of 4 cm, 7 cm, 10 cm, 12 cm, and 15 cm. When the organic light emitting display device is broken by the weight initially at the height of 4 cm, zero points are given; when broken by the weight initially at the height of 7 cm, 4 points are given; when broken by the weight initially at the height of 10 cm, 7 points are given; when broken by the weight initially at the height of 12 cm, 10 points are given; when broken by the weight initially at 15 cm, 12 points are given; and when not broken by the weight initially at the height of 15 cm, 15 points are given.

TABLE 1

| Test result | Including buffer member | Not including buffer member |
| --- | --- | --- |
| Thickness of resin | 0.2 | 0.2 |
| PET | "⌐" shape | — |
| Window thickness | 0.7(tempered) | 0.7(tempered) |

TABLE 1-continued

| Test result | Including buffer member | Not including buffer member |
|---|---|---|
| Panel size | 3.5" | 3.5" |
| Panel thickness | 0.5/0.4 | 0.5/0.4 |
| Bezel shape | Pass-through type | Pass-through type |
| [Results] | | |
| Height of damage | 4 cm: 4 | 4 cm: 3 |
|  | 7 cm: 3 | 7 cm: 6 |
|  | 12 cm: 3 | 12 cm: 1 |
| Survival rate | 10 cm - 30% | 10 cm - 0% |
| Points | 4.2/15 | 3.1/15 |

As shown in Table 1, when a buffer member is not included, 3.1 points are given but when a buffer member is included, 4.3 points are given. Thus, when a buffer member is included, resistance to impact of the organic light emitting display device 300 is improved by about 30% or more.

If the buffer member 333 is interposed between the first substrate 317 and the transparent protection window 327, the resistance to impact of the organic light emitting display device 300 may be improved. In addition, by including the buffer member 333 formed of a material having adhesive properties, the adhesive force between the first substrate 317 and the transparent protection window 327 may be increased.

Figure 4:
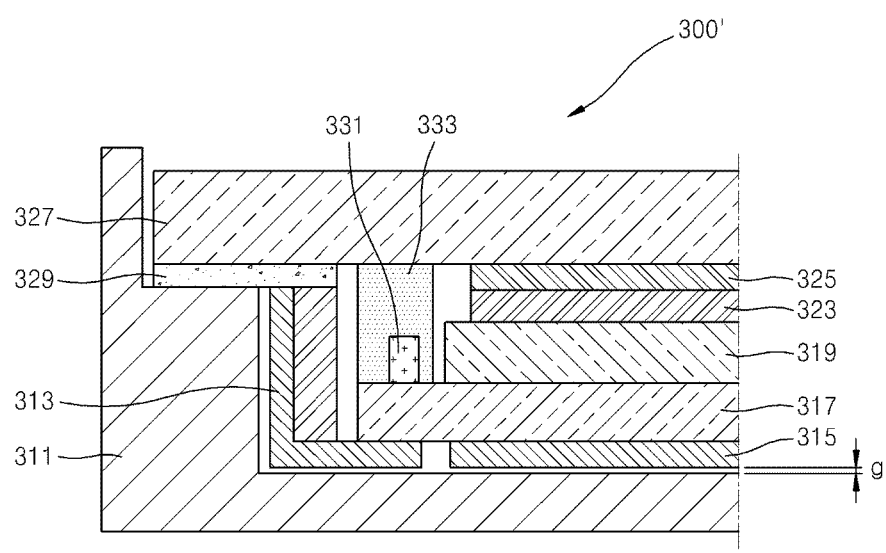
FIG. 4 is a cross-sectional view illustrating an organic light emitting display device according to a comparative example.

FIG. 4 is a cross-sectional view illustrating an organic light emitting display device 300' according to a comparative example of the present invention. Referring to FIG. 4, the organic light emitting display device 300' includes a housing 311, a frame 313, a compressed buffer tape 315, a first substrate 317, a second substrate 319, a sealing unit (not shown), a polarization plate 323, a resin 325, a transparent protection window 327, an adhesive member 329, a driver IC 331, and a buffer member 333. The organic light emitting display device 300' of FIG. 4 is different from the organic light emitting display device 300 of FIG. 3 in that a predetermined gap g is formed between the housing 311 and the frame 313, and between the housing 311 and the compressed buffer tape 315.

In detail, in the organic light emitting display device 100 illustrated in FIG. 1, when an impact is applied from the outside, the transparent protection window 127 is bent and thereby absorbs a portion of the impact, and the rest of the impact is transferred to a display unit (not shown). However, in the organic light emitting display device 200 illustrated in FIG. 2, an external impact is completely transferred to a display unit (not shown) without being buffered, and thus resistance to impact of the organic light emitting display device 200 is relatively low.

The feature of the organic light emitting display device 100 illustrated in FIG. 1 is applied to the organic light emitting display device 300. An experiment of buffering external impacts was conducted on the organic light emitting display device 300, including the predetermined gap g between the housing 311 and the frame 313, and between the housing 311 and the compressed buffer tape 315.

Table 2 below shows the result of impact tests performed on the organic light emitting display device 300 when the predetermined gap g is formed, and when the predetermined gap g is not formed, between the housing 311 and the frame 313, and between the housing 311 and the compressed buffer tape 315.

TABLE 2

| Test result | No gap included | Including a gap |
|---|---|---|
| Thickness of resin | 0.2 | 0.2 |
| PET | — | — |
| Window thickness | 0.7(tempered) | 0.7(tempered) |
| Panel size | 3.5" | 3.5" |
| Panel thickness | 0.5/0.4 | 0.5/0.4 |
| Bezel shape | Pass-through type | Pass-through type |
| [Results] | | |
| Height of damage | 4 cm: 3 | 4 cm: 10 |
|  | 7 cm: 6 | |
|  | 12 cm: 1 | |
| Survival rate | 10 cm - 0% | 10 cm - 0% |
| Points | 3.1/15 | 0/15 |

As shown in Table 2 below, when there is no gap, 3.1 points are given, but where there is a gap, 0 points are given. Thus, contrary to expectation, when there is no gap, resistance to impact is excellent. This is because, as either the housing 311 or the frame 313 bends, the gap g between the housing 311 and the frame 313 does not allow the housing 311 or the frame 313 to absorb a part of the impact.

Accordingly, with regard to improving resistance to impact, it is advantageous that no gap be formed between the housing 311 and the frame 313, and between the housing 311 and the compressed buffer tape 315, by closely adhering the frame 313 to the housing 311, and by closely adhering the compressed buffer tape 315 to the housing 311. Furthermore, it is advantageous that the frame 313 and the first substrate 317 also be closely adhered to each other in order to improve the resistance to impact.

According to the present invention, resistance to impact of the organic light emitting display devices, and the electronic devices including the organic light emitting display devices, is improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An electronic device comprising an organic light emitting display device and a housing for accommodating the organic light emitting display device:
    said organic light emitting display device comprising:
    a frame;
    a first substrate disposed on the frame, a display unit being formed on a surface of the first substrate;
    a second substrate disposed so as to face the first substrate;
    a driver integrated circuit (IC) disposed on one of the first substrate and the second substrate; and
    a buffer member formed so as to cover the driver IC;
    said electronic device further comprising a compressed buffer tape interposed between the housing and the first substrate;
    wherein the compressed buffer tape is closely adhered to, and in direct contact with, both the housing and the first substrate with no elements disposed between the compressed buffer tape and the housing, and with no elements disposed between compressed buffer tape and the first substrate,
    wherein a lower surface of the first substrate facing away from the second substrate is in immediate contact with the frame.

2. The electronic device of claim 1, wherein the substrate on which the driver IC is disposed, as selected from the first substrate and the second substrate, is longer than the substrate on which the driver IC is not disposed, and the driver IC is disposed on an extended portion of the substrate on which the driver IC is disposed.

3. The electronic device of claim 2, said electronic device further comprising:
   a transparent protection window disposed in front of the housing.

4. The electronic device of claim 3, wherein the buffer member is disposed between the first substrate and the transparent protection window.

5. The electronic device of claim 4, wherein the buffer member is disposed so as to contact the first substrate and the transparent protection window, respectively.

6. The electronic device of claim 3, wherein the housing and the frame are closely adhered to each other. respectively.

7. The electronic device of claim 1, wherein the frame and the first substrate are closely adhered to each other.

8. The electronic device of claim 7, said electronic device further comprising:
   a transparent protection window disposed in front of the housing.

9. The electronic device of claim 8, wherein the buffer member is disposed between the first substrate and the transparent protection window.

10. The electronic device of claim 9, wherein the buffer member is disposed so as to contact the first substrate and the transparent protection window, respectively.

11. The electronic device of claim 8, wherein the housing and the frame are closely adhered to each other.

12. The electronic device of claim 1, said electronic device further comprising:
   a transparent protection window disposed in front of the housing.

13. The electronic device of claim 12, wherein the buffer member is disposed between the first substrate and the transparent protection window.

14. The electronic device of claim 13, wherein the buffer member is disposed so as to contact the first substrate and the transparent protection window, respectively.

15. The electronic device of claim 12, wherein the housing and the frame are closely adhered to each other.

* * * * *